(12) United States Patent
Yamamura

(10) Patent No.: US 7,724,561 B2
(45) Date of Patent: May 25, 2010

(54) FERROELECTRIC MEMORY DEVICE, ITS DRIVING METHOD AND ELECTRONIC APPARATUS

(75) Inventor: Mitsuhiro Yamamura, Suwa (JP)

(73) Assignee: Seiko Epson Corporation (JP)

( * ) Notice: Subject to any disclaimer, the term of this patent is extended or adjusted under 35 U.S.C. 154(b) by 419 days.

(21) Appl. No.: 11/862,225

(22) Filed: Sep. 27, 2007

(65) Prior Publication Data

US 2008/0080224 A1    Apr. 3, 2008

(30) Foreign Application Priority Data

Oct. 2, 2006    (JP)    ............... 2006-270973

(51) Int. Cl.
*G11C 11/22*    (2006.01)
(52) U.S. Cl. .............. 365/145; 365/109; 365/117; 257/295
(58) Field of Classification Search ............. 365/49.13, 365/65, 109, 117, 145; 257/295, E21.208, 257/E21.663, E21.664, E27.104, E29.164
See application file for complete search history.

(56) References Cited

U.S. PATENT DOCUMENTS 6,147,895 A * 11/2000 Kamp .................. 365/145

FOREIGN PATENT DOCUMENTS

JP    2002-133857    5/2002

* cited by examiner

*Primary Examiner*—Richard Elms
*Assistant Examiner*—Harry W Byrne
(74) *Attorney, Agent, or Firm*—Harness, Dickey & Pierce, P.L.C.

(57) ABSTRACT

A ferroelectric memory device includes: a plurality of bit lines; a plurality of memory cells connected to each of the plurality of bit lines, and each storing "0" data with a smaller amount of readout charge or "1" data with a greater amount of readout charge according to a polarization state; a plurality of data lines; a plurality of charge transfer circuits that connect the plurality of bit lines to the plurality of data lines, respectively, based on a potential on each of the bit lines; a capacitor connected to each of the plurality of data lines for storing negative charge; a positive charge canceling circuit that pulls out positive charge corresponding to the amount of "0" data readout charge from each of the plurality of bit lines; and a sense amplifier that judges data read out from the memory cells.

13 Claims, 4 Drawing Sheets

FERROELECTRIC MEMORY DEVICE, ITS DRIVING METHOD AND ELECTRONIC APPARATUS

The entire disclosure of Japanese Patent Application No. 2006-270973, filed Oct. 2, 2006 is expressly incorporated by reference herein.

BACKGROUND

1. Technical Field

The invention relates to a ferroelectric memory device that stores data according to polarization states of a ferroelectric capacitor, a method for driving the same, and electronic apparatuses.

2. Related Art

In a ferroelectric memory device that stores data using the hysteresis characteristic of its ferroelectric capacitor, a readout voltage is applied to the plate line, and a potential on the bit line which elevates according to the amount of charge discharged from the ferroelectric capacitor and a reference potential are compared to each other, whereby data is judged. In this instance, the voltage applied to the plate line is voltage-divided by the capacitance of the ferroelectric capacitor and the parasitic capacitance. For this reason, the readout voltage applied to the ferroelectric capacitor becomes smaller than the readout voltage applied to the plate line. There is a trend to set the power supply voltage lower because of the demand for a reduction in the power consumption of electronic apparatuses. When the power supply voltage is low, the amount of readout charge discharged onto the bit line from the ferroelectric capacitor becomes smaller, and the readout margin lowers. To solve such a problem, a bit line sensing method has been proposed in which the initial potential on the bit line is controlled to be at a ground potential, and the readout voltage to be applied to the plate line is applied generally as it is to the ferroelectric capacitor thereby increasing the readout margin. For example, as a patent document describing the bit line ground sensing method, Japanese laid-open patent application JP-A-2002-133857 may be relevant.

According to an ordinary bit line ground sensing method, when the ferroelectric capacitance of "0" data is $Cf0$, the ferroelectric capacitance of "1" data is $Cf1$, the capacitance of a node to which charge on the bit line is transferred (hereafter, referred to as a data line) is $Ctank$, the initial potential on the data line is $-Vini$, the power source potential is $VCC$, the potential on the data line when "0" data is read out is $Vtank0$, and the potential on the data line when "1" is readout is $Vtank1$, the following relation is established.

$$Vtank0 = -Vini + VCC \times Cf0/Ctank$$

$$Vtank1 = -Vini + VCC \times Cf1/Ctank$$

This relation indicates that, the smaller the capacitance $Ctank$ of the data line, the greater the potential difference between the potential on the data line when "0" data is read out and the potential on the data line when "1" data is read out (hereafter referred to as the readout margin), whereby the readout accuracy can be improved.

However, because the potential on the data line would not become greater than the initial potential (ground potential) on the bit line, neither "$VCC \times Cf0/Ctank$" or "$VCC \times Cf1/Ctank$" would become greater than $Vini$. Therefore, the formula shown above can be expressed by a formula below. It is noted that, in the following formula, a function min is a function with a return value that is the smallest parameter among plural parameters.

$$Vtank0 = \min(VCC \times Cf0/Ctank, Vini) - Vini$$

$$Vtank1 = \min(VCC \times Cf1/Ctank, Vini) - Vini$$

The readout margin $\Delta V$ can be obtained as follows.

$$\Delta V = Vtank1 - Vtank0 = \min(VCC \times Cf1/Ctank, Vini) - \min(VCC \times Cf0/Ctank, Vini)$$

According to the above formula, the readout margin $\Delta V$ assumes a maximum value at a point where $Vtank1=0$. The value of $Ctank$ and the readout margin $\Delta Vmax$ at this moment are as follows.

$$Ctank = Cf1 \times VCC/Vini$$

$$\Delta Vmax = Vini(1 - Cf0/Cf1)$$

In theory, readout margins greater than $\Delta Vmax$ cannot be obtained by the bit line ground sensing method described above. For example, when $Cf0/Cf1=1/3$, $\Delta Vmax=2*Vini/3$. The design value of $Ctank$ has an optimum value, and the readout margin would reduce when its value is either greater or smaller.

SUMMARY

In accordance with an advantage of some aspects of the invention, it is possible to provide a ferroelectric memory device capable of securing its readout margin, while maintaining the capacitance of a capacitor that stores negative charge for pre-charging a data line to a negative potential at an optimum value, its driving method, and an electronic apparatus having the ferroelectric memory device.

In accordance with an embodiment of the invention, a ferroelectric memory device includes: a plurality of bit lines; a plurality of memory cells connected to each of the plurality of bit lines, and each storing "0" data with a smaller amount of readout charge or "1" data with a greater amount of readout charge according to a polarization state; a plurality of data lines; a plurality of charge transfer circuits that connect the plurality of bit lines to the plurality of data lines, respectively, based on a potential on each of the bit lines; a capacitor connected to each of the plurality of data lines for storing negative charge; a positive charge canceling circuit that pulls out positive charge corresponding to the amount of "0" data readout charge from each of the plurality of bit lines; and a sense amplifier that judges data read out from the memory cells.

By pulling out positive charge corresponding to the amount of "0" data readout charge from the bit line, an increase in the potential on the data line upon reading "0" data can be suppressed, such that the capacitance of a capacitor that stores negative charge for pre-charging the data line to a negative potential can be set in an optimum range, and therefore the readout margin can be increased.

In accordance with another embodiment of the invention, a ferroelectric memory device includes: a plurality of bit lines; a plurality of memory cells connected to each of the plurality of bit lines, and each storing "0" data with a smaller amount of readout charge or "1" data with a greater amount of readout charge according to a polarization state; a plurality of data lines; a plurality of charge transfer circuits that connect the plurality of bit lines to the plurality of data lines, respectively, based on a potential on each of the bit lines; a capacitor connected to each of the plurality of data lines for storing negative charge; a positive charge canceling circuit that extracts positive charge corresponding to a charge amount that is greater than the amount of "0" data readout charge but smaller than the amount of "1" data readout charge from each of the plurality of bit lines; and a sense amplifier that judges data read out from the memory cells.

By pulling out positive charge corresponding to a charge amount that is greater than the amount of "0" data readout charge but smaller than the amount of "1" data readout charge from the bit line in advance, an increase in the potential on the data line when reading "0" data can be suppressed, such that the capacitance of a capacitor that stores negative charge for pre-charging the data line to a negative potential can be set in an optimum range, and therefore the readout margin can be increased.

For example, when the ferroelectric capacitance of "1" data is Cf1, the ferroelectric capacitance of "0" data is Cf0, a voltage to be applied to a memory cell in reading data is VCC, and an initial potential on a data line is −Vini, the capacitance Ctank of a capacitor that stores negative charge for pre-charging the data line to a negative potential may preferably be lower than (Cf1−Cf0)×VCC/Vini.

In prior art, the maximum value ΔVmax of the readout margin ΔV is Vini (1−Cf0/Cf1), and even when the value of Ctank is set to be lower than Cf1×VCC/Vini, the readout margin cannot be increased greater than ΔVmax. In contrast, in accordance with the invention, positive charge is pulled out in advance from the bit line, whereby an increase in the potential on the data line when reading "0" data can be suppressed. Therefore the value of Ctank can be set smaller than (Cf1−Cf0)×VCC/Vini that is smaller than Cf1×VCC/Vini, whereby the readout margin can be increased.

Concretely, the positive charge canceling circuit may have, for example, one of the following circuit structures:

(1) a ferroelectric capacitor having a capacitance corresponding to a ferroelectric capacitance of "0" data;

(2) a paraelectric capacitor having a capacitance corresponding to a ferroelectric capacitance of "0" data;

(3) a paraelectric capacitor having a capacitance corresponding to a capacitance greater than a ferroelectric capacitance of "0" data and smaller than a ferroelectric capacitance of "1" data; and (4) a capacitor formed from a ferroelectric capacitor having a capacitance corresponding to a ferroelectric capacitance of "0" data and a paraelectric capacitor, wherein a composite value of their capacitances is smaller than a ferroelectric capacitance of "1" data.

By the use of a paraelectric capacitor in addition to a ferroelectric capacitor, fine adjustment of the amount of charge to be extracted from the bit line becomes easier.

As other concrete examples of the circuit structure of the positive charge canceling circuit, a device that pre-charges a bit line to a predetermined negative potential, or a switch that connects a bit line to a negative potential for a predetermined period of time may be enumerated.

By lowering the potential on a bit line to a negative potential, positive charge on the bit line can be canceled, and an increase in the potential on the data line upon reading out "0" data can be suppressed. By this, the capacitance of a capacitor that is connected to the data line and stores negative charge can be set in an optimum range, whereby the readout margin can be increased.

The positive charge canceling circuit may preferably pull out positive charge from the bit line before a readout voltage is applied to the memory cell.

By pulling out positive charge from the bit line at the timing before a readout voltage is applied to the memory cell, a greater readout voltage can be applied to the memory cell, such that the readout speed can be improved.

The positive charge canceling circuit may preferably pull out positive charge from the bit line at the timing generally concurrent with the timing at which a readout voltage is applied to the memory cell.

If a peripheral circuit such as the positive charge canceling circuit is driven at the timing before application of a readout voltage to the memory cell, there is a possibility that noise may enter the bit line. However, by driving the positive charge canceling circuit at the timing generally concurrent with the timing at which a readout voltage is applied to the memory cell, thereby pulling out positive charge from the bit line, the noise margin can be expanded.

An electronic apparatus in accordance with an embodiment of the invention is equipped with a ferroelectric memory device in accordance with an embodiment of the invention. It is noted that the electronic apparatus refers to any one of electronic apparatuses in general, without any particular limitation to their structure, which is equipped with the ferroelectric memory device in accordance with the invention and performs a specified function. The electronic apparatus includes any electronic apparatuses that require storing information, such as, for example, personal computers, cellular phones, PHS, PDA, electronic notebooks, IC cards, sheet computers, electronic paper, wearable computers, smart cards, video cameras, head-mount displays, projectors, RFID, facsimile apparatuses, portable TV sets, sheet-type calculators, and the like.

A method for driving a ferroelectric memory device in accordance with an embodiment of the invention pertains to a method for driving a ferroelectric memory device having a plurality of bit lines; a plurality of memory cells connected to each of the plurality of bit lines, and each storing "0" data with a smaller amount of readout charge or "1" data with a greater amount of readout charge according to a polarization state; a plurality of data lines; a plurality of charge transfer circuits that connect the plurality of bit lines to the plurality of data lines, respectively, based on a potential on each of the bit lines; a capacitor connected to each of the plurality of data lines for storing negative charge; a positive charge canceling circuit that pulls out positive charge; and a sense amplifier that judges data read out from the memory cells, the method including the steps of: before or generally concurrently with an application of a readout voltage to the memory cell, pulling out by the positive charge canceling circuit from each of the plurality of bit lines positive charge corresponding to the amount of "0" data readout charge or positive charge corresponding to the amount of charge greater than the amount of "0" data readout charge but smaller than the amount of "1" data readout charge of; and judging data by the sense amplifier.

By pulling out in advance positive charge corresponding to the amount of "0" data readout charge, or positive charge corresponding to a charge amount that is greater than the amount of "0" data readout charge but smaller than the amount of "1" data readout charge from the bit line, an increase in the potential on the data line when reading "0" data can be suppressed, such that the capacitance of a capacitor that stores negative charge for pre-charging the data line to a negative potential can be set in an optimum range, and therefore the readout margin can be increased.

DESCRIPTION OF EXEMPLARY EMBODIMENTS

Embodiments of the invention are described below with reference to the accompanying drawings. It is noted that the embodiments described below do not limit the invention set forth in the claimed invention. Also, not all combinations of the characteristics described in the embodiments are necessarily indispensable as the solution provided by the invention.

Figure 1:
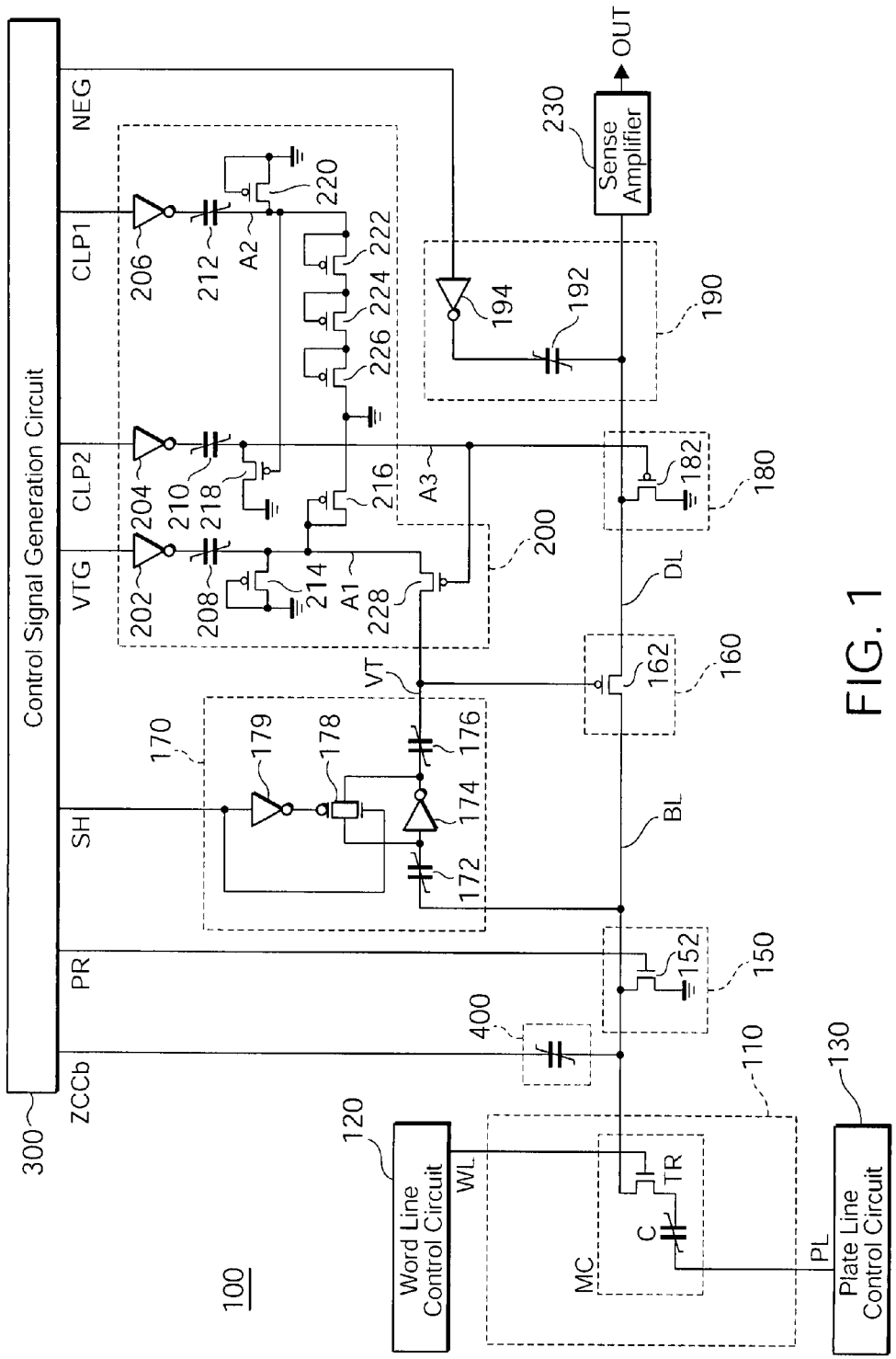
FIG. 1 is a circuit diagram of a ferroelectric memory device in accordance with an embodiment of the invention.

FIG. 1 is a circuit diagram of a ferroelectric memory device 100 in accordance with the present embodiment. The ferroelectric memory device 100 includes a memory cell array 110, a word line control circuit 120, a plate line control circuit 130, a pre-charging circuit 150, a charge transfer circuit 160, a transfer control circuit 170, a pre-charge circuit 180, a negative voltage generation circuit 190, a voltage control circuit 200, a sense amplifier 230, a control signal generation circuit 300, and a positive charge canceling circuit 400.

The memory cell array 110 has a plurality of memory cells MC. The memory cell MC is formed from an n-type MOS transistor TR and a ferroelectric capacitor C. The n-type MOS transistor TR has a gate connected to a word line WL, a source connected to a bit line BL, and a drain connected to one end of the ferroelectric capacitor C. The n-type MOS transistor TR switches based on a voltage on the word line WL as to whether or not the one end of the ferroelectric capacitor C is to be connected to the bit line BL.

The ferroelectric capacitor C has another end connected to a plate line PL, stores predetermined data based on a potential difference between the one end and the other end thereof, and discharges a predetermined amount of charge to the bit line based on the data stored. In the present embodiment, the ferroelectric capacitor C stores "1" data when the potential on the other end with respect to the potential on the one end is higher than its coercive voltage, and stores "0" data when the potential on the one end with respect to the potential on the other end is higher than its coercive voltage.

The word line control circuit 120 is connected to the word lines WL, and controls the potential on the word lines WL. Concretely, based on an address signal supplied from outside of the ferroelectric memory device 100, the word line control circuit 120 raises the potential on a word line WL corresponding to the address, thereby selecting memory cells MC connected to the word line WL.

The plate line control circuit 130 is connected to the plate lines PL, and controls the potential on the plate lines PL. Concretely, based on an address signal supplied from outside of the ferroelectric memory device 100, the plate line control circuit 130 raises the potential on a plate line PL corresponding to the address, thereby selecting the plate line PL.

It is noted that, for the convenience of description, only one memory cell MC is illustrated in the memory cell array 110. However, in effect, m×n (m and n are positive integers) memory cells MC are arranged in an array in the memory cell array 110. Also, the ferroelectric memory device 100 is provided with m word lines WL, m plate lines PL, n bit lines BL, n data lines DL and n charge transfer circuits 160.

The pre-charge circuit 150 is formed from an n-type MOS transistor 152 connected to the bit line BL. The n-type MOS transistor 152 has a source grounded, and a drain connected to the bit line BL. Also, the n-type MOS transistor 152 has a gate connected to the control signal generation circuit 300, and switches based on the voltage of a signal PR supplied to the gate as to whether the bit line BL is grounded or not.

The charge transfer circuit 160 is formed from a p-type MOS transistor 162. The p-type MOS transistor 162 has a source connected to the bit line BL, and a drain connected to the data line DL. The p-type MOS transistor 162 switches based on the voltage at the gate as to whether the bit line BL is connected to the data line DL or not.

Transfer control circuit 170 generates a voltage to be supplied to the charge transfer circuit 160. The transfer control circuit 170 is formed from ferroelectric capacitors 172 and 176, an inverter 174, a transfer gate 178 and an inverter 179.

The ferroelectric capacitor 172 has one end connected to the bit line BL, and the other end connected to an input of the inverter 174. The inverter 174 has an output connected to one end of the ferroelectric capacitor 176, and the other end of the ferroelectric capacitor 176 is connected to the charge transfer circuit 160. In other words, the ferroelectric capacitor 172, the inverter 174 and the ferroelectric capacitor 176 are connected in series, whose input is connected to the bit line BL and output connected to the charge transfer circuit 160.

The transfer gate 178 is connected to the input and the output of the inverter 174, and short-circuits the input and output of the inverter 174 based on a signal SH and an inverted signal of the signal SH outputted from the inverter 179 supplied to its gates.

In the charge transfer circuit 160, the output of the transfer control circuit 170, in other words, the other end of the ferroelectric capacitor 176 is connected to the gate of the p-type MOS transistor 162 that is connected to the bit line BL. Then, the transfer control circuit 170 controls the voltage to be supplied to the gate of the p-type MOS transistor 162 based on the potential on the bit line BL, and switches as to whether the bit line BL is connected to the data line DL or not.

The pre-charge circuit 180 is formed from a p-type MOS transistor 182. The p-type MOS transistor 182 has a source connected to the data line DL, and a drain grounded. The p-type MOS transistor 182 pre-charges the potential on the data line DL to the ground potential based on a voltage supplied to its gate.

The negative voltage generation circuit 190 is formed from a ferroelectric capacitor 192 and an inverter 194. The ferroelectric capacitor 192 has one end connected to the data line DL, and the other end connected to an output of the inverter 194. The inverter 194 receives a signal NEG as an input, and supplies its inverted signal to the other end of the ferroelectric capacitor 192. The negative voltage generation circuit 190 generates a negative potential on the data line DL, and the ferroelectric capacitor 192 stores negative charge generated on the data line DL.

The voltage control circuit 200 generates voltages to be supplied to the charge transfer circuit 160, the transfer control circuit 170 and the pre-charge circuit 180. The voltage control circuit 200 is formed from inverters 202-206, ferroelectric capacitors 208-212, and p-type MOS transistors 214-228.

The inverters 202-206 have inputs connected to the control signal generation circuit 300, and receive a signal VTG, a signal CLP2 and a signal CLP1 as inputs, respectively. Also the inverters 202-206 have outputs connected to one ends of the ferroelectric capacitors 208-212, respectively, and supply predetermined voltages to the one ends based on the signal VTG, the signal CLP2 and the signal CLP1, respectively.

The other end of the ferroelectric capacitor 208 is connected to the source of the p-type MOS transistor 228. The ferroelectric capacitor 208 generates a voltage to be supplied to the source of the p-type MOS transistor 228 based on the voltage supplied to the one end of the ferroelectric capacitor 208 from the inverter 202. Concretely, when the ground voltage is supplied to the one end, the ferroelectric capacitor 208 generates a predetermined negative voltage at the other end by coupling.

The p-type MOS transistor 214 has a source connected to the other end of the ferroelectric capacitor 208, and a gate and a drain grounded, and clamps the voltage at a node A1. Concretely, the p-type MOS transistor 214 is composed to clamp the voltage at the node A1 such that the potential at the node A1 would not excessively rise when a drive voltage VCC is supplied at the one end of the ferroelectric capacitor 208. For this reason, when the ground voltage is supplied to the one end of the ferroelectric capacitor 208, the potential at the node A1 becomes a negative potential as being boosted in the negative direction with the clamped voltage as a starting point. Also, the p-type MOS transistor 216 has a source and a gate connected to the other end of the ferroelectric capacitor 208, and a drain grounded, and clamps the voltage at the node A1. Concretely, the p-type MOS transistor 216 is composed to clamp the voltage at the node A1 such that the negative voltage that is generated by coupling and supplied to the source of the p-type MOS transistor 228 becomes equal or close to the threshold voltage of the p-type MOS transistor 162.

The ferroelectric capacitor 210 has the other end connected to the gates of the p-type MOS transistor 228 and the p-type MOS transistor 182. The ferroelectric capacitor 210 generates a voltage to be supplied to the gates of the p-type MOS transistor 228 and the p-type MOS transistor 182 based on the voltage supplied to the one end of the ferroelectric capacitor 210 from the inverter 204. Concretely, when the ground voltage is supplied to the one end, the ferroelectric capacitor 210 generates a voltage lower than two times the threshold voltage of the p-type MOS transistors 228 and 182 at the other end by coupling. Further, the ferroelectric capacitor 212 has the other end connected to the gate of the p-type MOS transistor 218, and generates a voltage to be supplied to the gate of the p-type MOS transistor 218 based on a voltage supplied to the one end thereof.

The p-type MOS transistor 218 has a source connected to the other end of the ferroelectric capacitor 210 and a drain grounded, and pre-charges, based on the voltage at a node A2, the voltage at a node A3 to which the other end of the ferroelectric capacitor 210 is connected to the ground potential.

The P-type MOS transistors 222-226 are diode-connected in series, and clamp the voltage at the node A2. Concretely, the drain of the p-type MOS transistor 226 is grounded, and the gate and the source of the p-type MOS transistor 222 are connected to the other end of the ferroelectric capacitor 212.

The p-type MOS transistor 220 has a source connected to the other end of the ferroelectric capacitor 212, and a gate and a drain grounded, and clamps the voltage at the node A2. Concretely, the p-type MOS transistor 220 is composed to clamp the voltage at the node A2 such that the potential at the node A2 would not excessively rise when a drive voltage VCC is supplied at the one end of the ferroelectric capacitor 212. For this reason, when the ground voltage is supplied to the one end of the ferroelectric capacitor 212, the potential at the node A2 becomes a negative potential as being boosted in the negative direction with the clamped voltage as a starting point.

The sense amplifier 230 compares the potential on the data line DL with a reference potential unshown, thereby judging as to whether data stored in a memory cell MC is "0" data or "1" data, and outputs the comparison result as an output OUT. When the potential on the data line DL upon reading "0" data from the memory cell MC is Vtank0, and the potential on the data line DL upon reading "1" data is Vtank1, the reference potential may be set to, for example, (Vtank0+Vtank1)/2.

The positive charge canceling circuit 400 is a circuit for pulling out from the bit line BL positive charge corresponding to the amount of "0" data readout charge, and may be, for example, a ferroelectric capacitor having a capacitance corresponding to a ferroelectric capacitance of "0" data. The bit line BL is connected to one end of the ferroelectric capacitor composing the positive charge canceling circuit 400, and a signal ZCCb from the control signal generation circuit 300 is supplied to the other end thereof. The positive charge canceling circuit 400 pulls out positive charge from the bit line BL by capacitance coupling of the ferroelectric capacitor, for example, when the signal ZCCb changes from the power supply voltage VCC to the ground potential.

When the ferroelectric capacitance of "0" data is Cf0, the ferroelectric capacitance of "1" data is Cf1, the capacitance of the ferroelectric capacitor 192 connected to the data line DL is Ctank, the initial potential on the data line DL is –Vini, the power supply potential is VCC, the potential on the data line DL when reading out "0" data is Vtank0, the potential on the data line DL when reading out "1" data is Vtank1, and the readout margin is ΔV, the following relation is established, as the amount of charge of "0" data (VCC×Cf0) is pulled out from the bit line BL at the timing before or generally concurrently with the timing at which a readout voltage is applied to the memory cell MC.

$Vtank0 = -Vini$ $Vtank1 = -Vini + \min(VCC \times (Cf1 - Cf0)/Ctank, Vini)$ $\Delta V = Vtank1 - Vtank0 = \min(VCC \times (Cf1 - Cf0)/Ctank, Vini)$ In this case, the value of Ctank that maximizes ΔV can be designed to be smaller than Cf1×VCC/Vini, such that the readout margin can be increased compared to prior art. The readout margin ΔV reaches the maximum value at a point where Vtank1=0. As the values of Ctank and ΔV at this point are assumed to be Ctank_min and ΔVmax, respectively, the following relation is established.

$Ctank\_min \leq (Cf1 - Cf0) \times VCC/Vini$ $\Delta Vmax = Vini$

At this moment, the value ΔVmax becomes independent from the ratio between Cf1 and Cf0. By designing the value of Ctank to be smaller than (Cf1–Cf0)×VCC/Vini, the readout margin ΔV theoretically, always assumes the maximum value.

It is noted that, even though positive charge that is greater than the amount of "0" data readout charge and smaller than the amount of "1" data readout charge is pulled out from the bit line BL by the positive charge canceling circuit 400, the value of Ctank that maximizes ΔV can be designed to be smaller than Cf1×VCC/Vini, such that the readout margin can be increased compared to prior art. In other words, the amount of charge to be pulled out from the bit line BL by the positive charge canceling circuit 400 may only have to be the amount of positive charge that is equal to or greater than the amount of "0" data readout charge and smaller than the amount of "1"

data readout charge, and may more preferably be equal to the amount of "0" data readout charge.

Figure 2:
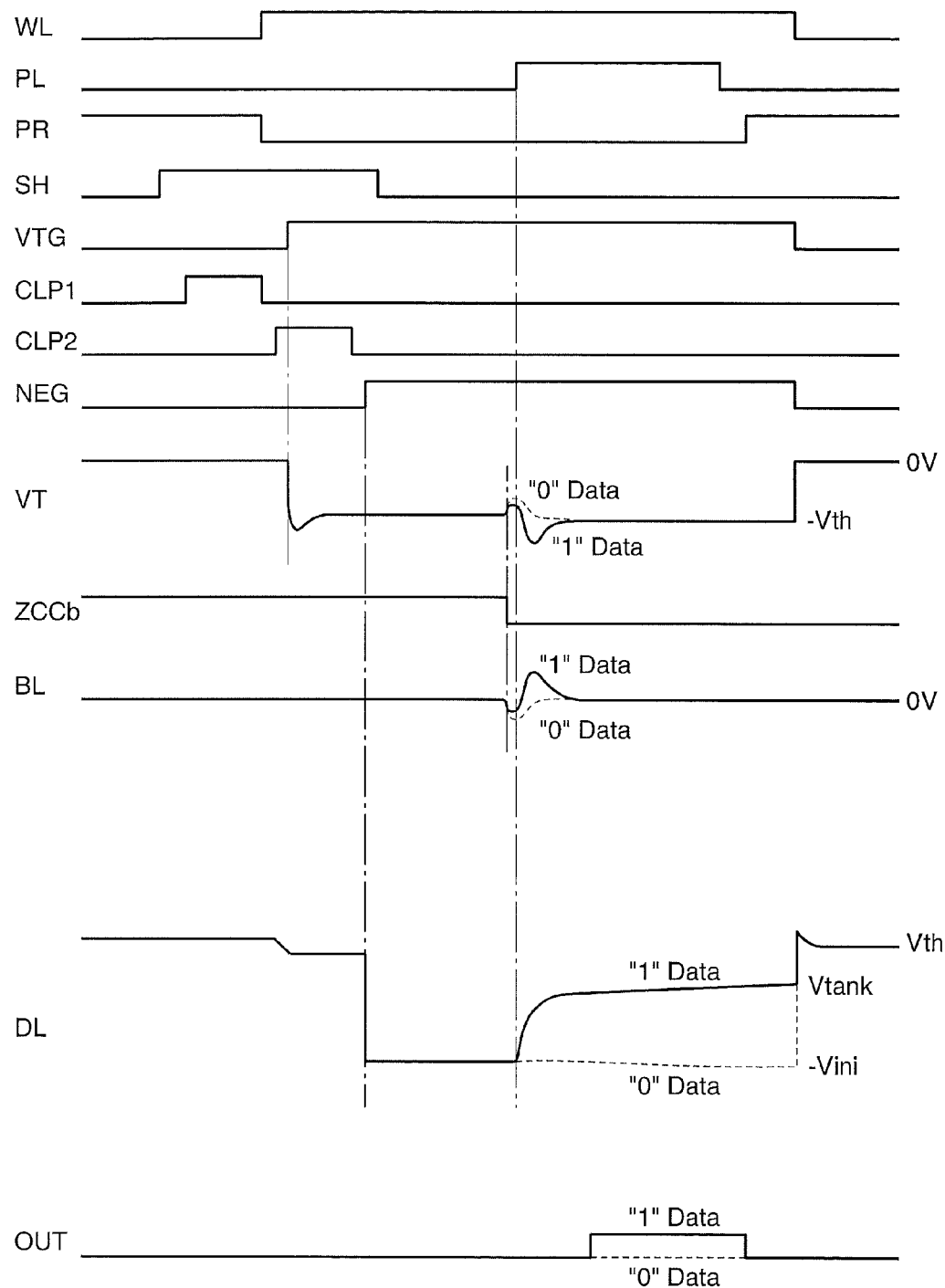
FIG. 2 is a timing chart showing operations of the ferroelectric memory device in accordance with the embodiment.

FIG. 2 is a timing chart showing operations of the ferroelectric memory device 100 in accordance with the present embodiment. Referring to FIG. 1 and FIG. 2, operations of the ferroelectric memory device 100 in accordance with the present embodiment is described, using an example in which data stored in a memory cell MC connected to the word line WL and the bit line BL is read out.

In the following example, when a signal indicates L logic, the potential of the signal is a ground potential, and when a signal indicates H logic, the potential of the signal is a drive voltage of the ferroelectric memory device 100, such as, VCC, VDD or DPP. However, the potential of each signal is not limited to the above, and it is only required that the potential of a signal indicating H logic is higher than the potential of a signal indicating L logic.

First, in an initial state, the control signal generation circuit 300 outputs H logic as a signal PR, thereby turning on the n-type MOS transistor 152. By this, the bit line BL is grounded. Then, the control signal generation circuit 300 outputs H logic as a signal SH, thereby turning on the transfer gate 178, whereby the input and the output of the inverter 174 are short-circuited.

Next, the control signal generation circuit 300 sets the signal CLP1 to H logic. By this, the output of the inverter 206 changes from H logic to L logic, whereby the voltage on the other end of the ferroelectric capacitor 212, in other words, the voltage on the node A2 becomes a negative voltage by coupling, the p-type MOS transistor 218 turns on, and the node A3 is grounded.

Then, the control signal generation circuit 300 sets the signal CLP1 to L logic to turn off the p-type MOS transistor 218 and set the signal CLP2 to H logic. By this, the voltage on the other end of the ferroelectric capacitor 210, in other words, the voltage at the node A3 becomes a negative voltage by coupling, the p-type MOS transistor 228 turns on, and the node VT is connected to the node A1. On the other hand, p-type MOS transistor 182 turns on, and the data line DL is similarly grounded.

Also, the control signal generation circuit 300 sets the bit line BL in a floating state by setting the signal PR to L logic. The word line control circuit 120 elevates the potential on the word line WL, thereby turning on the n-type MOS transistor TR composing the memory cell MC connected to the word line WL. By this, the ferroelectric capacitor C composing the memory cell MC connected to the word line WL is connected to the bit line BL.

Then, the control signal generation circuit 300 sets the signal VTG to H logic. By this, the output of the inverter 202 changes from H logic to L logic, whereby the voltage on the other end of the ferroelectric capacitor 208, in other words, the voltage at the node A1 becomes a negative voltage by coupling. As the p-type MOS transistor 228 has turned on, the voltage at the node VT, in other words, at the gate of the p-type MOS transistor 162 also becomes a negative voltage. As described above, in accordance with the present embodiment, when the signal VTG changes from L logic to H logic, the voltage at the node A1 becomes equal or close to the threshold voltage (−Vth) of the p-type MOS transistor 162. Accordingly, when the signal VTG changes from L logic to H logic, the node VT, in other words, the gate of the p-type MOS transistor 162 is charged to its threshold voltage or a voltage close thereto.

Then, the control signal generation circuit 300 sets the signal CLP2 to L logic, thereby turning off the p-type MOS transistor 182 and the p-type MOS transistor 228, and setting the signal NEG to H logic. By this, the output of the inverter 194 changes from H logic to L logic, such that the potential on the data line DL connected to the ferroelectric capacitor 192 is charged to a negative potential by coupling. When the potential on the gate with respect to the source of the p-type MOS transistor 162 is Vgs, the data line DL may preferably be charged to a voltage lower than −|Vgs−Vth|. By this, the p-type MOS transistor 162 operates in a saturated region when it is turned on, such that the charge can be transferred at high speeds from the bit line BL to the data line DL.

Then, the control signal generation circuit 300 sets the signal SH to L logic, thereby electrically cutting off the input from the output of the inverter 174. Then, the control signal generation circuit 300 sets the signal ZCCb to L logic, and immediately thereafter, the plate line control circuit 130 elevates the voltage on the plate line PL to VCC. By this, positive charge corresponding to "0" data is pulled out from the bit line BL by the positive charge canceling circuit 400, and immediately thereafter, the voltage of VCC is applied to the ferroelectric capacitor C with the potential on the bit line BL as a reference, whereby readout charge is discharged from the ferroelectric capacitor C to the bit line BL. Because positive charge corresponding to "0" data is pulled out from the bit line BL, the potential on the bit line BL momentarily lowers from the ground potential to a negative potential, but again elevates by the readout charge discharged from the ferroelectric capacitor C to the bit line BL.

When the data stored in the ferroelectric capacitor C is "0" data, the potential on the bit line BL lowers from the ground potential to a negative potential, and then again returns to the ground potential (dotted line in the figure). At this time, with the potential change on the bit line BL, the potential on the node VT slightly elevates from −Vth, and then again returns to −Vth (dotted line in the figure). Also, because the Vgs of the p-type MOS transistor 162 does not exceed the threshold voltage (−Vth), the p-type MOS transistor 162 remains to be turned off, and charge transfer from the bit line BL to the data line DL does not take place.

On the other hand, when the data stored in the ferroelectric capacitor C is "1" data, the potential on the bit line BL lowers from the ground potential to a negative potential, and then elevates to a positive potential, exceeding the ground potential (solid line in the figure). At this moment, with the potential change on the bit line BL, the potential on the one end of the ferroelectric capacitor 172 connected to the bit line BL also elevates, and the voltage at the node VT, in other words, the voltage at the gate of the p-type MOS transistor 162, which is charged to the threshold voltage (−Vth) or a voltage close to the threshold voltage, further drops (solid line in the figure), whereby Vgs becomes greater. At the same time, the potential on the bit line BL also elevates. When Vgs exceeds the threshold voltage (−Vth), the p-type MOS transistor 162 turns on, and the bit line BL is connected to the data line DL.

In the present embodiment, the data line DL is charged to a voltage sufficiently lower than the voltage on the bit line BL, such that, when the bit line BL is connected to the data line DL, the charge discharged from the ferroelectric capacitor C to the bit line BL is transferred through the p-type MOS transistor 162 to the data line DL.

It is noted that the charge transfer capability of the p-type MOS transistor 162 becomes greater in proportion to the square of |Vgs−Vth|.

As the charge is transferred from the bit line BL to the data line DL, the potential on the bit line BL gradually lowers according to the amount of charge being transferred. In other words, the voltage on the input of the ferroelectric capacitor 172 composing the transfer control circuit 170 lowers, such that the voltage on the node VT, in other words, on the gate of the p-type MOS transistor 162 also gradually elevates, and becomes a voltage near its threshold voltage (−Vth). By this, the charge transfer speed of the p-type MOS transistor 162 connected to the bit line BL becomes lower. Then, when the potential on the bit line BL becomes the ground potential (0V), the p-type MOS transistor 162 turns off, whereby the bit line BL is electrically cut off from the data line DL, and the charge transfer is completed.

In other words, when the charge is discharged from the ferroelectric capacitor C to the bit line BL and the potential on the bit line BL elevates, the charge transfer circuit 160 and the transfer control circuit 170 transfer the charge disposed onto the bit line BL to the data line DL at high speeds. Then, when the charge discharged onto the bit line BL is transferred to the data line DL, and the voltage on the bit line BL lowers, the high-speed transfer ends, and when the potential on the bit line BL reaches the ground potential, the charge transfer circuit 160 and the transfer control circuit 170 electrically cut off the bit line BL from the data line DL, whereby the transfer of charge is completed.

Accordingly, the potential on the data line DL to which the charge is transferred from the bit line BL connected to the ferroelectric capacitor C that stores "1" data greatly rises at high speeds, and then gradually rises to the voltage Vtank1 (solid line in the figure). On the other hand, when the ferroelectric capacitor C stores "0" data, the potential on the data line DL stays at −Vini, and does not change (dotted line in the figure).

It is noted that, when the capacitance value Ctank of the ferroelectric capacitor 192 is less than (Cft−Cf0)×VCC/Vini, Vtank rises to the ground potential, and the readout margin ΔV becomes the maximum value Vini.

The sense amplifier 230 compares the potential on the data line DL and a reference potential unshown, and outputs a signal OUT based on the result of comparison. When "1" data is stored in the ferroelectric capacitor C, the potential on the data line DL elevates to Vtank1, and therefore H logic is outputted as the signal OUT. On the other hand, when "0" is stored in the ferroelectric capacitor C, the potential on the data line DL remains at −Vini, and therefore L logic is outputted as the signal OUT. Through the operations described above, the data stored in the ferroelectric capacitor C is read out.

By the ferroelectric memory device 100 in accordance with the present embodiment, positive charge corresponding to the amount of "0" data readout charge is pulled out in advance from the bit line BL, whereby an increase in the potential on the data line DL when "0" data is read out can be suppressed. Therefore, the capacitance of the ferroelectric capacitor 192 that stores negative charge for pre-charging the data line DL to a negative potential can be set in an optimum range, whereby the readout margin can be increased.

Also, the optimum value of the capacitance Ctank of the ferroelectric capacitor 192 can be set below Cf1×VCC/Vini, which is an advantage in that the design margin can be widened.

Also, at the time of data readout, positive charge is pulled out from the bit line BL, such that the potential on the bit line becomes a negative potential, and therefore a greater readout voltage can be applied to the memory cell MC. Accordingly, the amount of readout charge can be increased, and therefore the readout speed can be improved.

The embodiment examples and application examples described above with reference to the embodiments of the invention may be appropriately combined, modified or improved for specific uses, and the invention is not limited to the embodiments described above.

For example, the timing at which positive charge is pulled out from the bit line BL by the positive charge canceling circuit 400 may be at the timing before or generally concurrent with the application of a readout voltage to the plate line PL. In the case where the timing at which positive charge is pulled out from the bit line BL by the positive charge canceling circuit 400 is at the timing generally concurrent with the application of a readout voltage to the plate line PL, when the memory cell MC stores "0" data, the potential on the node VT hardly changes, and the p-type MOS transistor 162 remains being turned off.

Also, for example, the positive charge canceling circuit 400 may be quipped with any one of circuit structures shown in FIGS. 3-6.

Figure 3:
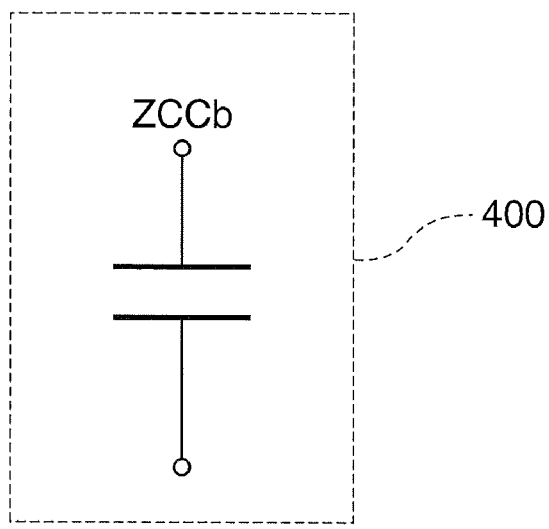
FIG. 3 is a circuit diagram of a positive charge canceling circuit.

The positive charge canceling circuit 400 shown in FIG. 3 is formed from a paraelectric capacitor having a capacitance corresponding to a ferroelectric capacitance of "0" data, or a paraelectric capacitor having a capacitance corresponding to a capacitance greater than a ferroelectric capacitance of "0" data and smaller than a ferroelectric capacitance of "1" data.

Figure 4:
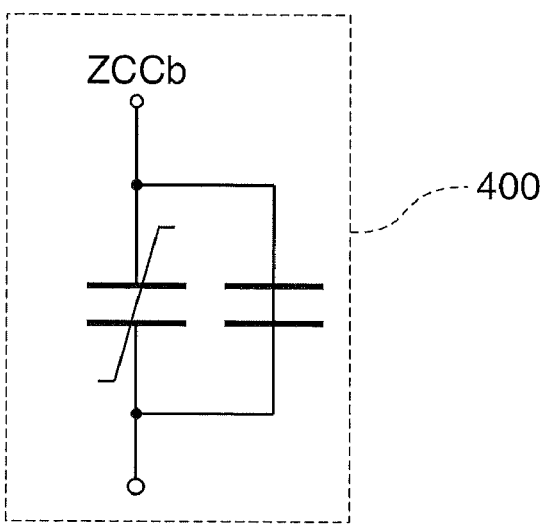
FIG. 4 is a circuit diagram of a positive charge canceling circuit.

The positive charge canceling circuit 400 shown in FIG. 4 is formed from a capacitor formed from a ferroelectric capacitor having a capacitance corresponding to a ferroelectric capacitance of "0" data and a paraelectric capacitor, wherein a composite value of their capacitances is smaller than a ferroelectric capacitance of "1" data.

Figure 5:
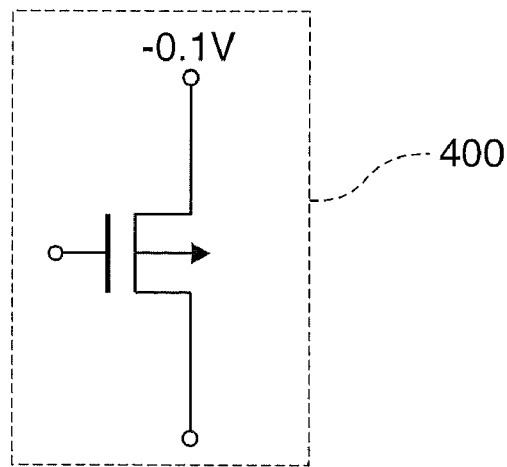
FIG. 5 is a circuit diagram of a positive charge canceling circuit.

The positive charge canceling circuit 400 shown in FIG. 5 is formed from a p-type MOS transistor that functions as a pre-charging device that pre-charges the bit line BL to a negative potential through connecting the bit line BL to a negative potential (for example, −0.1V) for a sufficient period of time (the time required for pre-charging).

Figure 6:
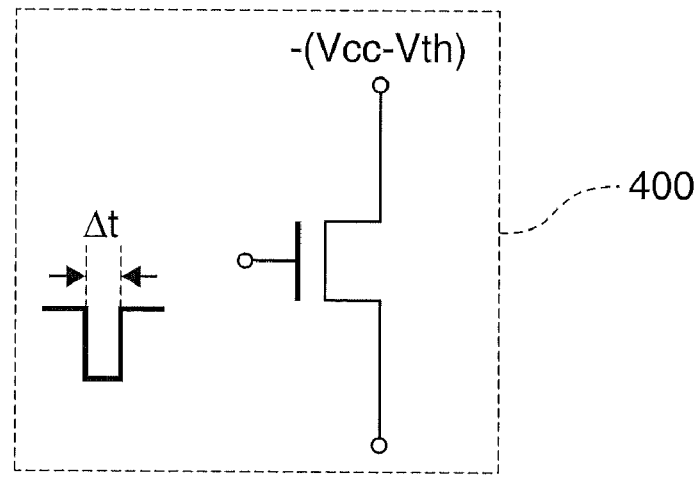
FIG. 6 is a circuit diagram of a positive charge canceling circuit.

The positive charge canceling circuit 400 shown in FIG. 6 is formed from a p-type MOS transistor that functions as a switch that instantaneously connects the bit line BL to a negative potential, thereby injecting negative charge to the bit line BL, and instantaneously lowering the potential on the bit line BL.

It is noted that the transistor as a pre-charging device or a switch may preferably be a p-type MOS transistor, so that a current would not punch through the substrate when the bit line BL is pre-charged to a negative potential.

It is noted that, in the case of pulling out positive charge from the bit line BL at the timing before the plate line PL is driven, any one of the positive charge canceling circuits 400 shown in FIG. 1, FIG. 3 and FIG. 6 may be used. By pulling out positive charge from the bit line BL at the timing before the plate line PL is driven, a greater readout voltage can be applied to the memory cell MC, which provides an advantage in that the readout speed can be improved.

When positive charge is pulled out from the bit line BL at the timing generally concurrent with the timing at which the plate line PL is driven, any one of the positive charge canceling circuits 400 shown in FIG. 1, FIG. 3 and FIG. 4 can be used. If peripheral circuits such as the positive charge canceling circuit 400 are driven at the timing before the plate line PL is driven, there is a possibility that noise enters the bit line BL. However, by driving the positive charge canceling circuit 400 at the timing generally concurrent with the timing at which the plate line PL is driven, thereby pulling out positive charge from the bit line BL, the noise margin can be expanded.

In the embodiment described above, an example in which the ferroelectric capacitor 192 is used to generate a negative potential on the data line DL is described. However, independent of the ferroelectric capacitor 192, it is possible to use a structure in which a circuit having a structure similar to that of the negative voltage generation circuit 190 is prepared to generate a negative potential on the data line DL, and then the circuit is cut off from the data line.

Also, as a device to store negative charge generated on the data line DL, the parasitic capacitance of the data line DL (including the wiring capacitance, the junction capacitance of the p-type MOS transistors 162 and 182, the capacitance of the sense amplifier 230) may be used, instead of the ferroelectric capacitor 192.

When the capacitance of a capacitor that stores negative potential generated on the data line DL is set to a very small value, high Vtank potential can be obtained even when "1" data deteriorates and the readout charge becomes smaller. However, when "0" data deteriorates and the readout charge becomes larger, and exceeds the positive charge pulled out, Vtank potential rapidly elevates, such that the readout margin lowers. For this reason, in the case where substantial deterioration of "1" data is expected, and slight deterioration of "0" data is expected, it is possible to set the capacitance of a capacitor that stores negative potential generated on the data line DL to a very small value.

It is noted that, when substantial deterioration of "0" data is expected, positive charge to be pulled out from the bit line BL is set to a large value.

Also, the embodiments are described above, using so-called 1T1C type memory cells as an example. However, the invention may also be applicable to 2T2C type memory cells. When 2T2C type memory cells are used, a reference potential for judging data is not necessary.

The embodiment examples and application examples described above with reference to the embodiments of the invention may be appropriately combined, modified or improved for specific uses, and the invention is not limited to the descriptions of the embodiments described above. It is obvious from the scope of claimed invention that such combined, modified or improved modes are also included in the scope of technology of the invention.

What is claimed is:

1. A ferroelectric memory device comprising:
a plurality of bit lines;
a plurality of memory cells connected to each of the plurality of bit lines, and each storing "0" data with a smaller amount of readout charge or "1" data with a greater amount of readout charge according to a polarization state;
a plurality of data lines;
a plurality of charge transfer circuits that connect the plurality of bit lines to the plurality of data lines, respectively, based on a potential on each of the bit lines;
a capacitor connected to each of the plurality of data lines for storing negative charge;
a positive charge canceling circuit that pulls out positive charge corresponding to the amount of "0" data readout charge from each of the plurality of bit lines; and
a sense amplifier that judges data read out from the memory cells.

2. A ferroelectric memory device comprising:
a plurality of bit lines;
a plurality of memory cells connected to each of the plurality of bit lines, and each storing "0" data with a smaller amount of readout charge or "1" data with a greater amount of readout charge according to a polarization state;
a plurality of data lines;
a plurality of charge transfer circuits that connect the plurality of bit lines to the plurality of data lines, respectively, based on a potential on each of the bit lines;
a capacitor connected to each of the plurality of data lines for storing negative charge;
a positive charge canceling circuit that extracts positive charge corresponding to a charge amount that is greater than the amount of "0" data readout charge but smaller than the amount of "1" data readout charge from each of the plurality of bit lines; and
a sense amplifier that judges data read out from the memory cells.

3. A ferroelectric memory device according to claim 1, wherein the capacitor has a capacitance lower than $(Cf1-Cf0) \times VCC/Vini$, where the ferroelectric capacitance of "1" data is $Cf1$, the ferroelectric capacitance of "0" data is $Cf0$, a voltage to be applied to a memory cell in reading data is VCC, and an initial potential on the data line is $-Vini$.

4. A ferroelectric memory device according to claim 1, wherein the positive charge canceling circuit is a ferroelectric capacitor having a capacitance corresponding to a ferroelectric capacitance of "0" data.

5. A ferroelectric memory device according to claim 1, wherein the positive charge canceling circuit is a paraelectric capacitor having a capacitance corresponding to a ferroelectric capacitance of "0" data.

6. A ferroelectric memory device according to claim 1, wherein the positive charge canceling circuit is a paraelectric capacitor having a capacitance corresponding to a capacitance greater than a ferroelectric capacitance of "0" data and smaller than a ferroelectric capacitance of "1" data.

7. A ferroelectric memory device according to claim 1, wherein the positive charge canceling circuit is a capacitor formed from a ferroelectric capacitor having a capacitance corresponding to a ferroelectric capacitance of "0" data and a paraelectric capacitor, wherein a composite value of the capacitances is smaller than a ferroelectric capacitance of "1" data.

8. A ferroelectric memory device according to claim 1, wherein the positive charge canceling circuit is a device that pre-charges the bit line to a predetermined negative potential.

9. A ferroelectric memory device according to claim 1, wherein the positive charge canceling circuit is a switch that connects the bit line to a negative potential for a predetermined period of time.

10. A ferroelectric memory device according to claim 1, wherein the positive charge canceling circuit pulls out positive charge from the bit line before a readout voltage is applied to the memory cell.

11. A ferroelectric memory device according to claim 1, wherein the positive charge canceling circuit pulls out positive charge from the bit line at the timing generally concurrent with the timing at which a readout voltage is applied to the memory cell.

12. An electronic apparatus comprising the ferroelectric memory device recited in claim 1.

13. A method for driving a ferroelectric memory device having a plurality of bit lines, a plurality of memory cells connected to each of the plurality of bit lines, and each storing "0" data with a smaller amount of readout charge or "1" data with a greater amount of readout charge according to a polarization state, a plurality of data lines, a plurality of charge transfer circuits that connect the plurality of bit lines to the plurality of data lines, respectively, based on a potential on each of the bit lines, a capacitor connected to each of the plurality of data lines for storing negative charge, a positive charge canceling circuit that pulls out positive charge from each of the plurality of bit lines, and a sense amplifier that judges data read out from the memory cells, the method comprising the steps of:

before or generally concurrently with an application of a readout voltage to the memory cell, pulling out by the positive charge canceling circuit from each of the plurality of bit lines positive charge corresponding to the amount of "0" data readout charge or positive charge corresponding to the amount of charge greater than the amount of "0" data readout charge but smaller than the amount of "1" data readout charge; and judging data by the sense amplifier.

* * * * *